(12) United States Patent
Forrest et al.

(10) Patent No.: US 9,412,960 B2
(45) Date of Patent: Aug. 9, 2016

(54) LIGHT TRAPPING ARCHITECTURE FOR PHOTOVOLTAIC AND PHOTODECTOR APPLICATIONS

(75) Inventors: Stephen R. Forrest, Ann Arbor, MI (US); Richard R. Lunt, Okemos, MI (US); Michael Slootsky, Ann Arbor, MI (US)

(73) Assignee: THE REGENTS OF THE UNIVERSITY OF MICHIGAN, Anna Arbor, MI (US)

( * ) Notice: Subject to any disclaimer, the term of this patent is extended or adjusted under 35 U.S.C. 154(b) by 958 days.

(21) Appl. No.: 13/099,850

(22) Filed: May 3, 2011

(65) Prior Publication Data

US 2012/0261558 A1 Oct. 18, 2012

Related U.S. Application Data

(60) Provisional application No. 61/476,683, filed on Apr. 18, 2011.

(51) Int. Cl.
*H01L 31/00* (2006.01)
*H01L 51/44* (2006.01)
(Continued)

(52) U.S. Cl.
CPC ............ *H01L 51/447* (2013.01); *G02B 5/0808* (2013.01); *H01L 31/0543* (2014.12);
(Continued)

(58) Field of Classification Search
CPC ......... Y02E 10/47; Y02E 10/50; Y02E 10/52; H01L 31/0525; H01L 31/0527; H01L 51/447; H01L 31/0522; H01L 31/058; H01L 31/0749; H01L 31/0543; H01L 31/0547

USPC ........................ 250/214, 203.4; 136/246, 259
See application file for complete search history.

(56) References Cited

U.S. PATENT DOCUMENTS 4,033,325 A * 7/1977 Walker .......................... 126/638
4,556,048 A * 12/1985 Maki et al. .................... 126/569
(Continued)

FOREIGN PATENT DOCUMENTS

JP 2001-144309 A 5/2001
WO WO00-11500 A1 3/2000
(Continued)

OTHER PUBLICATIONS

International Search Report in corresponding PCT Application No. PCT/US11/34971.

*Primary Examiner* — Georgia Y Epps
*Assistant Examiner* — Kevin Wyatt
(74) *Attorney, Agent, or Firm* — Finnegan, Henderson, Farabow, Garrett & Dunner, LLP

(57) ABSTRACT

There is disclosed photovoltaic device structures which trap admitted light and recycle it through the contained photosensitive materials to maximize photoabsorption. For example, there is disclosed a photosensitive optoelectronic device comprising: a first reflective layer comprising a thermoplastic resin; a second reflective layer substantially parallel to the first reflective layer; a first transparent electrode layer on at least one of the first and second reflective layer; and a photosensitive region adjacent to the first electrode, wherein the first transparent electrode layer is substantially parallel to the first reflective layer and adjacent to the photosensitive region, and wherein the device has an exterior face transverse to the planes of the reflective layers where the exterior face has an aperture for admission of incident radiation to the interior of the device.

34 Claims, 8 Drawing Sheets

Winston Collector

Does Not Require Solar Tracking

(51) Int. Cl.
  *G02B 5/08*    (2006.01)
  *H01L 31/054*  (2014.01)
  *H01L 31/0232* (2014.01)
  *H01L 51/42*   (2006.01)

(52) U.S. Cl.
  CPC ......... *H01L31/0547* (2014.12); *H01L 31/0232* (2013.01); *H01L 51/4246* (2013.01); *Y02E 10/52* (2013.01); *Y02E 10/549* (2013.01)

(56) References Cited

U.S. PATENT DOCUMENTS

| | | | |
|---|---|---|---|
| 6,333,458 B1 * | 12/2001 | Forrest et al. | 136/259 |
| 8,339,700 B2 * | 12/2012 | Watanabe et al. | 359/359 |
| 2001/0011551 A1 * | 8/2001 | Peumans et al. | 136/259 |
| 2010/0043871 A1 * | 2/2010 | Xia et al. | 136/251 |
| 2010/0218808 A1 * | 9/2010 | Penciu | 136/246 |
| 2012/0006401 A1 | 1/2012 | Takanashi et al. | |

FOREIGN PATENT DOCUMENTS

| | | |
|---|---|---|
| WO | WO01-39280 A1 | 5/2001 |
| WO | WO2008-053740 A1 | 5/2008 |
| WO | WO2010/100943 | 9/2010 |
| WO | WO2011-078486 A2 | 6/2011 |

* cited by examiner

There is significant Angle Dependence

Spectralon Reflector

Typical 8" Hemispherical Reflectance of SRS-99 and DSRS-99

- Spectralon has almost no Angle Dependence

Sample SRS-99 (99%) → Change in reflectance from normal incidence

| Wavelength (nm) | ΔR(45°) | ΔR(61°) |
|---|---|---|
| 300 | +0.009 | +0.010 |
| 600 | -0.006 | -0.005 |
| 900 | -0.002 | +0.001 |
| 1200 | -0.002 | -0.003 |
| 1500 | -0.003 | -0.002 |
| 1800 | -0.004 | +0.000 |
| 2100 | +0.015 | +0.013 |
| 2400 | +0.022 | +0.015 |

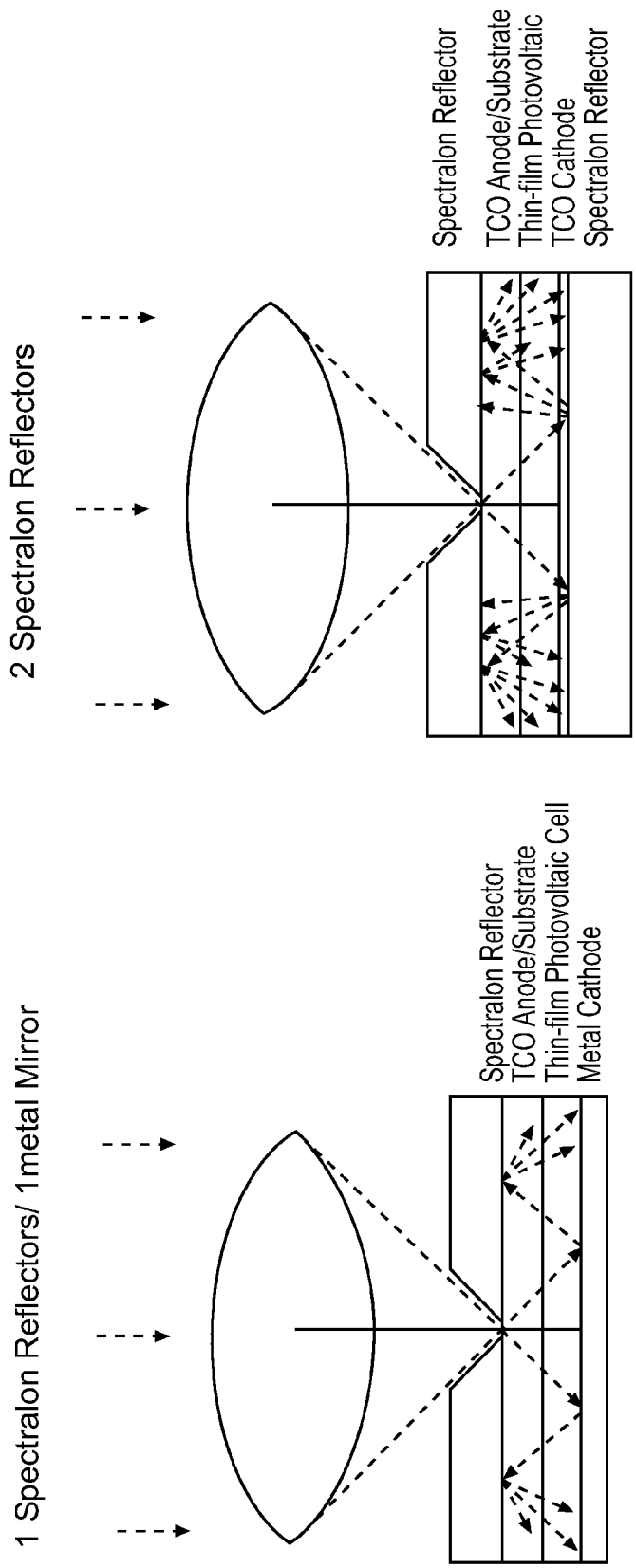

Improvement in Absorption

Assume:
- Fixed absorption for 1 pass (at 45°)
- Neglect microcavity effects
- Average Entrance Angle of 45°
- n = 0.27 + 6i for Ag (average across visible spectrum)
- n = 1.7 + 0.1i for material next to Mirror
- Reflectance fixed at 99% for Spectralon

| % Absorption (1-pass) | Number Bounces for Max Absorption (loss + abs) | Total Absorption of Film (w Ag mirror) | % Loss From Ag | % Loss From 1Ag/1Spectralon | ~% Loss From 2 Spectralon | Improvement (Ag - 2Spec.) |
|---|---|---|---|---|---|---|
| 5% | 20 | 80% | 20% | 10% | 1.0% | 19% |
| 10% | 10 | 81% | 19% | 10% | 0.9% | 18% |
| 30% | 3 | 86% | 14% | 7% | 0.7% | 13% |
| 50% | 2 | 91% | 9% | 5% | 0.5% | 9% |

LIGHT TRAPPING ARCHITECTURE FOR PHOTOVOLTAIC AND PHOTODECTOR APPLICATIONS

CROSS-REFERENCE TO RELATED APPLICATION

This application claims the benefit of U.S. Provisional Application No. 61/476,683, filed Apr. 18, 2011, which is incorporated herein by reference in its entirety.

STATEMENT REGARDING FEDERALLY SPONSORED RESEARCH

This invention was made with U.S. Government support under Contract No. FA9550-07-1-0364 awarded by the Air Force Office of Scientific Research and DE-FG36-08G018022 awarded by the Department of Energy. The government has certain rights in this invention.

JOINT RESEARCH AGREEMENT

The claimed invention was made by, on behalf of, and/or in connection with one or more of the following parties to a joint university-corporation research agreement: The University of Michigan and Global Photonic Energy Corporation. The agreement was in effect on and before the date the invention was made, and the claimed invention was made as a result of activities undertaken within the scope of the agreement.

FIELD OF THE DISCLOSURE

The present disclosure generally relates to thin-film photovoltaic devices (PVs), such as solar cells, with structural designs to increase light trapping properties and reduce losses across a large spectral range. The present disclosure also relates to a low cost fabrication process for making such photovoltaic devices.

BACKGROUND

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m2, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, ff.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, ff, defined as:

$$ff = \{I_{max}V_{max}\}/\{I_{SC}V_{OC}\} \quad (1)$$

where ff is always less than 1, as $I_{SC}$ and $V_{OC}$ are never obtained simultaneously in actual use. Nonetheless, as ff approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\gamma_P$, may be calculated by:

$$\gamma_P = ff^*(I_{SC}{}^*V_{OC})/P_{inc}$$

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \Psi S_0^*$. Here $S_0$ and $S_0^*$ denote ground and excited molecular states, respectively. This energy absorption is associated with the promotion of an electron from a bound state in the HOMO energy level, which may be a B-bond, to the LUMO energy level, which may be a B*-bond, or equivalently, the promotion of a hole from the LUMO energy level to the HOMO energy level. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other, as opposed to recombination with holes or electrons from other pairs. To produce a photocurrent the electron-hole pair becomes separated, typically at a donor-acceptor interface between two dissimilar contacting organic thin films. If the charges do not separate, they can recombine in a geminant recombination process, also known as quenching, either radiatively, by the emission of light of a lower energy than the incident light, or non-radiatively, by the production of heat. Either of these outcomes is undesirable in a photosensitive optoelectronic device.

Electric fields or inhomogeneities at a contact may cause an exciton to quench rather than dissociate at the donor-acceptor interface, resulting in no net contribution to the current. Therefore, it is desirable to keep photogenerated excitons away from the contacts. This has the effect of limiting the diffusion of excitons to the region near the junction so that the associated electric field has an increased opportunity to separate charge carriers liberated by the dissociation of the excitons near the junction.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the highest occupied molecular orbital (HOMO) energy level and the lowest unoccupied molecular orbital (LUMO) energy level, called the HOMO-LUMO gap. The Fermi energy characterizes the statistical occupation of molecular quantum energy states denoted by the value of energy for which the probability of occupation is equal to ½. A Fermi energy near the LUMO energy level indicates that electrons are the predominant carrier. A Fermi energy near the HOMO energy level indicates that holes are the predominant carrier. Accordingly, the Fermi energy is a primary characterizing property of traditional semiconductors and the prototypical PV heterojunction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cell, such as reported by Tang, *Appl. Phys Lett.* 48, 183 (1986), contain a heterojunction analogous to that employed in a conventional inorganic PV cell. However, it is now recognized that in addition to the establishment of a p-n type junction, the energy level offset of the heterojunction also plays an important role.

The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices ($F \sim 10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process. That is, carrier generation requires exciton generation, diffusion and ionization or collection. There is an efficiency γ associated with each of these processes. Subscripts may be used as follows: P for power efficiency, EXT for external quantum efficiency, A forphoton absorption, ED for diffusion, CC for collection, and INT for internal quantum efficiency. Using this notation:

$$\gamma_P \sim \gamma_{EXT} = \gamma_A * \gamma_{ED} * \gamma_{CC}$$

$$\gamma_{EXT} = \gamma_A * \gamma_{INT}$$

The diffusion length ($L_D$) of an exciton is typically much less ($L_D \sim 50\text{Å}$) than the optical absorption length ($\sim 500\text{Å}$), requiring a trade-off between using a thick, and therefore resistive, cell with multiple or highly folded interfaces, or a thin cell with a low optical absorption efficiency.

The falloff in intensity of an incident flux of electromagnetic radiation through a homogenous absorbing medium is generally given by $I=I_o e^{-\alpha x}$ where $I_0$ is the intensity at an initial position (X=0), α is the absorption constant and x is the depth from x=0. Thus, the intensity decreases exponentially as the flux progresses through the medium. Accordingly, more light is absorbed with a greater thickness of absorbent media or if the absorption constant can be increased. Generally, the absorption constant for a given photoconductive medium is not adjustable. For certain photoconductive materials, e.g., 3,4,9,10 perylenetetracarboxylic-bis-benzimidazole (PTCBI), or copper phthalocyanine (CuPc), very thick layers are undesirable due to high bulk resistivities.

By suitably re-reflecting or recycling light several times through a given thin film of photoconductive material the optical path through a given photoconductive material can be substantially increased without incurring substantial additional bulk resistance. A solution is needed, which efficiently permits electromagnetic flux to be collected and delivered to the cavity containing the photoconductive material while also confining the delivered flux to the cavity so that it can absorbed.

Less expensive and more efficient devices for photogeneration of power have been sought to make solar power competitive with presently cheaper fossil fuels. Organic photoconductors, such as CuPc and PTCBI, have been sought as materials for organic photovoltaic devices (OPVs) due to potential cost savings. The high bulk resistivities noted above make it desirable to utilize relatively thin films of these materials. However, the use of very thin organic photosensitive layers presents other obstacles to production of an efficient device. As explained above, very thin photosensitive layers absorb a small fraction of incident radiation thus keeping down external quantum efficiency.

Another problem is that very thin films are more subject to defects such as shorts from incursion of the electrode material. U.S. Pat. No. 6,333,458, incorporated herein by reference, describes photosensitive heterostructures incorporating one or more exciton blocking layers which address some of the problems with very thin film OPVs. However, other solutions are needed to address the problem of low photoabsorption by very thin films, whether the films are organic or inorganic photoconductors.

The use of optical concentrators, as known as Winston collectors is common in the field of solar energy conversion. Such concentrators have been used primarily in thermal solar collection devices wherein a high thermal gradient is desired. To a lesser extent, they have been used with photovoltaic solar conversion devices. However, it is thought that such applications have been directed to devices wherein photoabsorption was expected to occur upon initial incidence of light upon the active photoconductive medium. If very thin photoconductor layers are used, it is likely that much of the concentrated radiation will not be absorbed. It may be reflected back into the device environment, absorbed by the substrate or merely pass through if the substrate is transparent. Thus, the use of concentrators alone does not address the problem of low photoabsorption by thin photoconductive layers. Optical concentrators for radiation detection have also been used for the detection of Cerenkov or other radiation with photomultiplier ("PM") tubes. PM tubes operate on an entirely different principle, i.e., the photoelectric effect, from solid state detectors such as the OPVs of the present invention. In a PM tube, low photoabsorption in the photoabsorbing medium, i.e., a metallic electrode, is not a concern, but PM tubes require high operating voltages unlike the OPVs disclosed herein.

Light focusing and trapping is an important avenue to increasing the performance of thin film photovoltaic solar cells and photodetectors. However, the mirrors typically used in such schemes utilize metals, such as silver or gold, which can result in significant loss of incident photons due to spectral absorption of the mirror. Thus, it would be advantageous to provide a structure to increase the light-trapping in a thin film photovoltaic solar cell or photodetector with reduced losses across a large spectral range.

The cross-sectional profile of an exemplary non-imaging concentrator is depicted in FIG. 1. This cross-section applies to both a conical concentrator, such as a truncated paraboloid, and a trough-shaped concentrator. With respect to the conical shape, the device collects radiation entering the circular entrance opening of diameter d1 within ±8 max (the half angle of acceptance) and directs the radiation to the smaller exit opening of diameter d2 with negligible losses and can approach the so-called thermodynamic limit. This limit is the maximum permissible concentration for a given angular field of view. A trough-shaped concentrator having the cross-section of FIG. 1 aligned with its y axis in the east-west direction has an acceptance field of view well suited to solar motion and achieves moderate concentration with no diurnal tracking. Vertical reflecting walls at the trough ends can effectively recover shading and end losses. Conical concentrators provide higher concentration ratios than trough-shaped concentrators but require diurnal solar tracking due to the smaller acceptance angle. See *High Collection Nonimaging Optics* by W. T. Welford and R. Winston, pp 172-175, Academic Press, 1989, incorporated herein by reference.

SUMMARY OF INVENTION

In view of the foregoing, there is disclosed photovoltaic device structures which trap admitted light and recycle it through the contained photosensitive materials to maximize photoabsorption. These device structures may be suited for use in combination with optical concentrators.

There is also disclosed a high efficiency photoconversion structure for trapping and converting incident light to electrical energy, optionally including an optical concentrator to increase the collection of light. Non-limiting examples of optical concentrators that can be used according to the present disclosure include conical parabolic and trough-shaped parabolic optical concentrators.

In one embodiment, there is disclosed a high efficiency photoconversion structure in which the incident light is admitted generally perpendicular to the planes of the photosensitive material layers. In another embodiment, there is disclosed a high efficiency photoconversion structure in which the incident light is admitted generally parallel to the planes of the photosensitive material layers.

Aside from the subject matter discussed above, the present disclosure includes a number of other exemplary features such as those explained hereinafter. It is to be understood that both the foregoing description and the following description are exemplary only.

BRIEF DESCRIPTION OF THE DRAWINGS

FIG. 5 is an architectural representation of photosensitive optoelectronic devices consistent with embodiments of the invention, comprising (a) one Spectralon Reflector and one metal mirror; and (b) two Spectralon Reflectors.

FIG. 6 shows the improvement in absorption using spectralon reflectors as depicted in FIG. 5. show array of light collectors for trapping over large areas and include Winston collectors as an option

FIG. 9(a) shows the total reflectance of the microcellular reflective sheet in FIG. 8, whereas

DETAILED DESCRIPTION OF THE INVENTION

Figure 1:
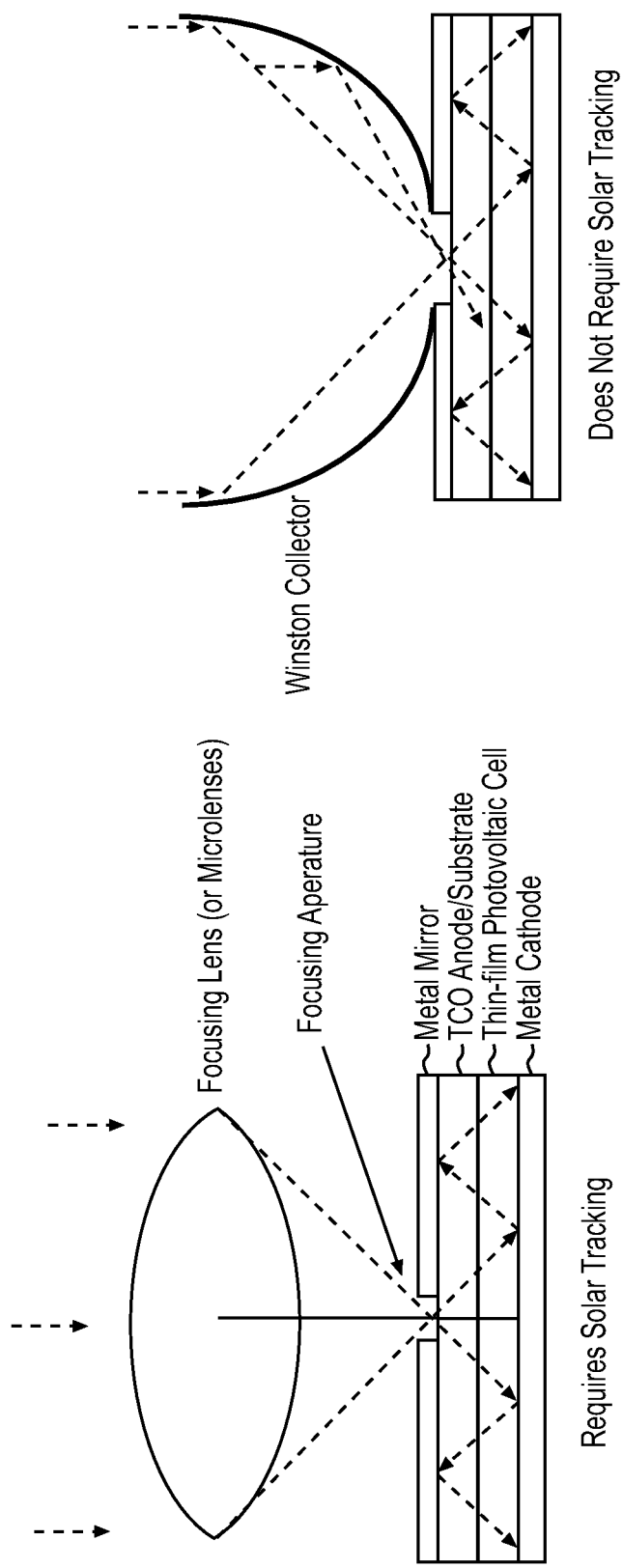
FIG. 1 depicts light trapping with (a) metal mirrors and (b) Winston collectors.

In FIG. 1, a cross-sectional view which can correspond to two different device structures is depicted. Both structures permit light to be introduced into a reflective cavity, or waveguide, containing photosensitive layers such that the light is initially incident in a direction generally perpendicular to the planes of the photosensitive layers. As a result, this type of structure is generally referred to herein as a "perpendicular type structure."

Accordingly, light incident from the top of these embodiments enters into one or more concentrator structures (conical) or (trough-shaped). The light admitted to each concentrator is then reflected into an aperture or top reflective layer. The aperture is a generally circular shaped opening for use with a conical concentrator, and the aperture is a generally rectangular shaped opening for use with a trough-shaped concentrator. As the bottom surface layer is reflective, the top surface may be non-reflective and/or be optionally coated with, for example, a protective layer to enhance weather resistance. Passivated oxides or polymer coatings, for example, may be suitable protective coatings. After passing through the aperture, the admitted radiation is trapped in a waveguide structure formed between top layer and bottom reflective layer. The space between the two layers may be occupied by several layers comprising a thin film photovoltaic device of the type such as those disclosed in the following U.S. Pat. Nos. 6,352,777; 6,297,495; 6,278,055; 6,198,092; 6,198,091; and 6,333,458, all of which are herein incorporated by reference in their entirety.

An exemplary embodiment of a thin film PV cell with an optical concentrator geometry is provided by FIG. 1. Below the top layer is a transparent insulating layer of, for example, glass or plastic, through which the light admitted by the focusing aperture and initially traverses. On its initial pass, the light then traverses a transparent electrode of, for example, degenerately doped indium tin oxide (ITO), as well as through one or more active layers. Non-limiting examples of such active layers include one or more rectifying junctions, or exciton blocking layers for efficient conversion of optical energy to electrical energy. Any light which is not absorbed on this initial pass is reflected back through active layers, transparent electrode, and transparent insulating layer to be reflected off of top layer to repeat the cycle again until the light is completely absorbed.

The top and/or bottom layers may be comprised of a metallic material or a dielectric stack of the type known in the art. The bottom layer may be a metallic film such as silver or aluminum which also can serve as the lower electrode. Alternatively, the lower electrode could be in whole or part a transparent conductive material such as degenerately doped ITO in conjunction with a reflective metallic film which in turn could optionally be deposited upon a substrate such as glass, metal or plastic. FIG. 1 depicts two typical incident light rays. Those of ordinary skill in the art will appreciate that there are numerous other possible trajectories for incident radiation and that the ray depicted is merely for illustration.

The process of trapping the admitted light until it is absorbed enhances the efficiency of the photoconversion and may be referred to as "optical recycling" or "photon recycling." A structure designed to trap light within it may generally be called a "waveguide structure," or also an "optical cavity" or "reflective cavity." The optical recycling possible within such optical cavities or waveguide structures can be advantageous in devices utilizing relatively high resistance organic photosensitive materials since much thinner photoactive layers may be used without sacrificing conversion efficiency.

Figure 2:
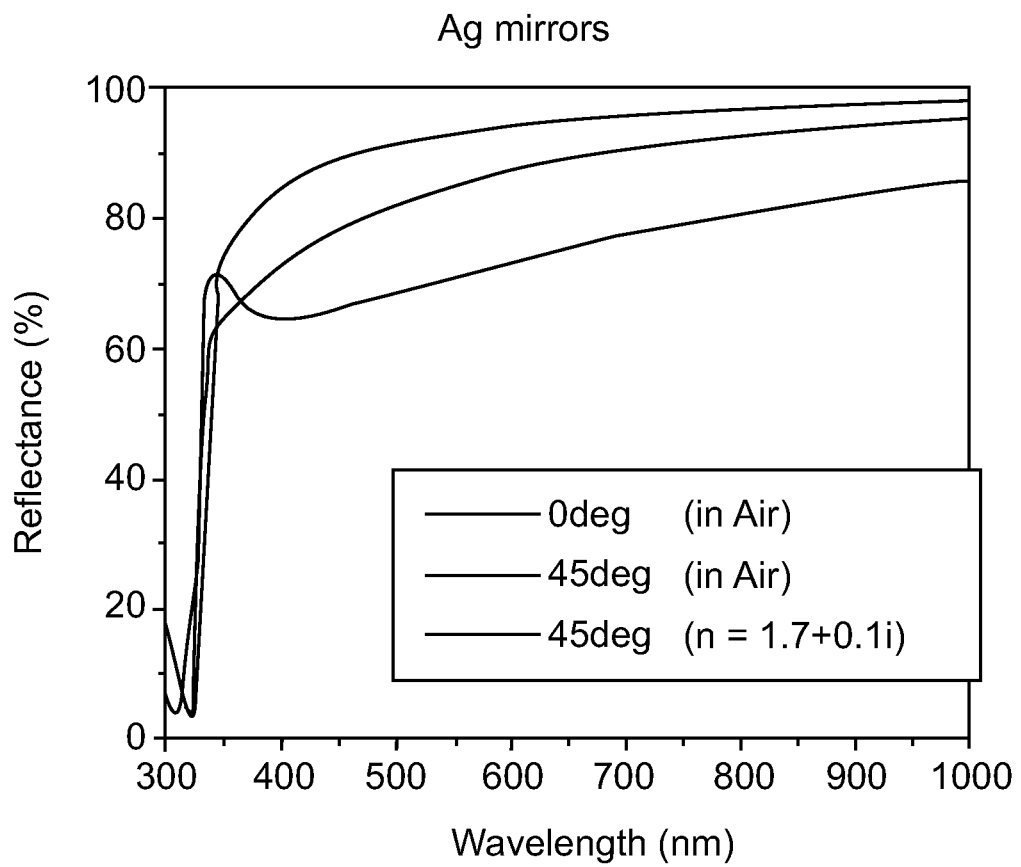
FIG. 2 represents the angle dependence using traditional metal mirrors.

FIG. 2 shows the angle dependence associated with metal mirrors, such as Ag mirrors.

Figure 3:
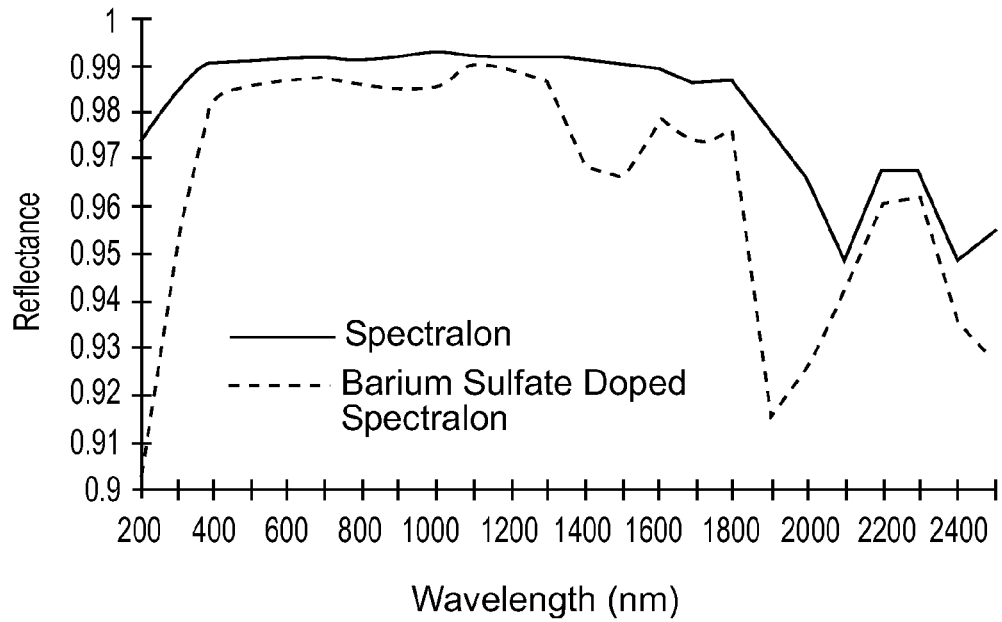
FIG. 3 represents the angle dependence using reflectors consistent with embodiments of the invention.

In contrast to FIG. 2, FIG. 3, shows essentially no angle dependence utilizing Spectralon reflectors according to the present invention.

Figure 4:
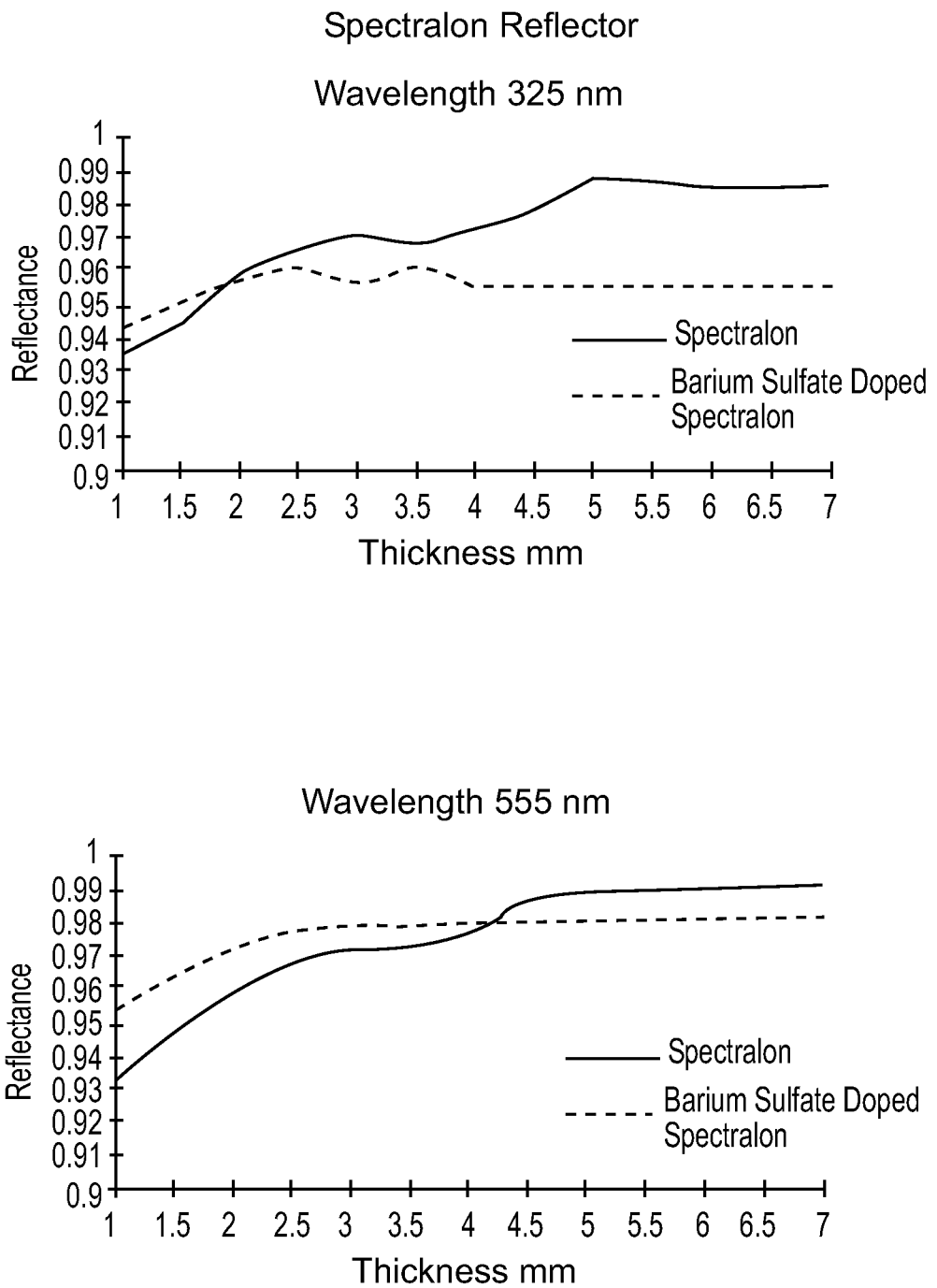
FIG. 4 shows the reflectance vs. thickness using reflectors consistent with embodiments of the invention.

FIG. 4 shows reflectance as a function of thickness of Spectralon reflectors according to the invention.

FIG. 5 is a representation of the difference in light trapping and/or scattering with 1 reflector and 1 metal mirror (5a) compared to 2 reflectors (5b), which are absent metal mirrors. As shown, because there is almost no specular reflection from the Spectralon Reflectors, and only diffuse scattering, light trapping is more efficient in the embodiment shown in FIG. 5b, comprising 2 Spectralon Reflectors.

With respect to the embodiments shown in FIG. 5, the top layer comprises a transparent insulating layer, such as, for example, a spectralon reflector. The light admitted by the focusing aperture initially traverses a transparent insulating layer of, for example, glass or plastic, which is located below the top layer. The light also initially traverses a transparent electrode of, for example, degenerately doped indium tin oxide (ITO), as well as one or more active layers.

Non-limiting examples of the one or more active layers include one or more rectifying junctions, or exciton blocking layers for efficient conversion of optical energy to electrical energy. Any light which is not absorbed on this pass is reflected back through active layers, transparent electrode, and transparent insulating layer to be reflected off of top layer to repeat the cycle again until the light is completely absorbed. The top and/or bottom layers may be comprised of a metallic material or a thermoplastic resin. The bottom layer may be a metallic film, such as silver or aluminum or a thermoplastic resin which also can serve as the lower electrode.

Alternatively, the lower electrode could be in whole or part a transparent conductive material such as degenerately doped ITO in conjunction with a reflective metallic film which in turn could optionally be deposited upon a substrate such as glass, metal or plastic. FIG. 5 depicts two photosensitive optoelectronic devices comprising a top and/or bottom layer having either a metallic film, or thermoplastic resin, or both.

In one embodiment, the photosensitive optoelectronic device depicted in FIG. 5, comprising both a top and bottom layer selected from thermoplastic resin exhibits almost no specular reflection and only diffuse scattering of light.

In FIG. 6 a description of the improvement in absorption using spectralon reflectors as depicted in FIG. 5 is provided.

Figure 7:
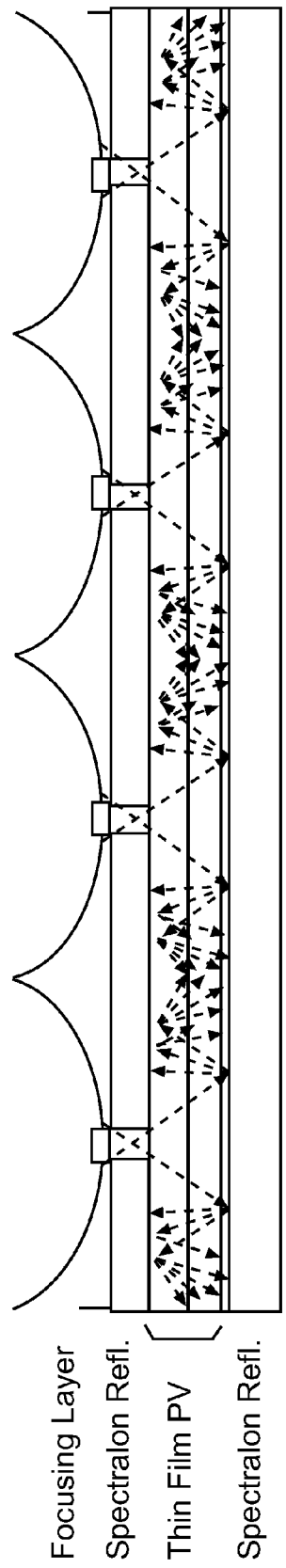
FIG. 7 shows an array of light collectors for trapping over large areas including Winston collectors as an option.

FIG. 7 shows an embodiment comprising an array of light collectors for trapping over large areas. This embodiment can include Winston collectors as an option.

Figure 8:
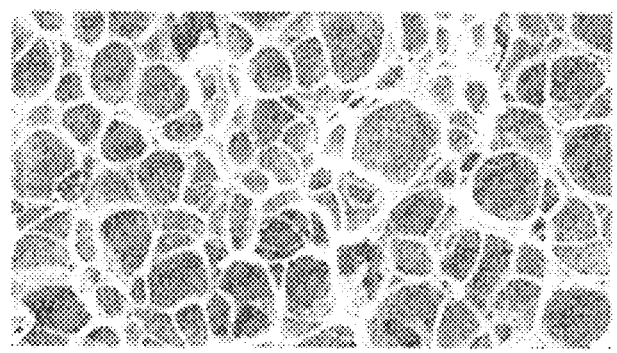
FIG. 8 is a pictorial representation of a microcellular reflective sheet according to one embodiment of the invention.

FIG. 8 is an SEM micrograph of a microcellular reflective sheet used in one embodiment of the invention. This material comprises the following characteristics shown in Table 1.

TABLE 1

| Property | Description |
| --- | --- |
| Material | Foamed PET, white (polyethylene terephtalate) |
| Thickness (Tolerance) | 0.94 mm (−0.08, +0.08 mm) |
| Width (Tolerance) | 600 mm (−0, +5 mm) |
| Length (Tolerance) | 1,000 mm 1,200 mm 1,500 mm (−0, +20 mm) |
| Density (Tolerance) | 345 kg/m3 (−30, +30 kg/m3) |
| Total reflectivity | 99% (relative reflectivity with BaSO4 at 550 nm) |
| Diffuse reflectivity | 96% (relative reflectivity with BaSO4 at 550 nm) |
| Tensile strength (Direction) | 13.5 MPa (MD) 13.5 MPa (TD) |
| Bending strength (Direction) | 900 MPa (MD) 750 MPa (TD) |
| Flame resistance certification | UL 94-HBF (File No. E99693) |
| Glow wire Test | IEC 60695 GWFI 960/0.95, GMIT 850/0.95 |

The microcellular reflective sheet described above has excellent reflection power, a total reflectivity of 99% or more, a diffuse reflectivity of 96% or more, is lightweight and has high impact strength, a shape holding temperature <160° C., is made of non harmful materials, comprises a smooth surface, and is of micro meter size foams, which means diameters of 10 μm or less.

Figure 9A:
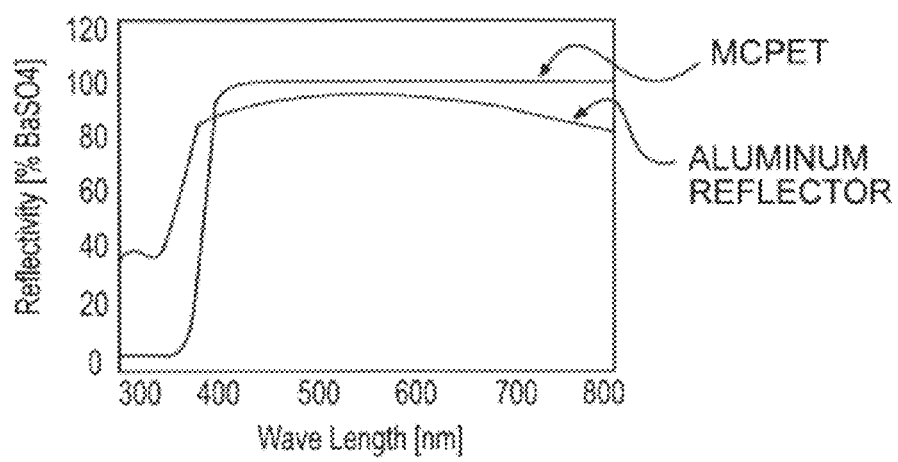
Figure 9B:
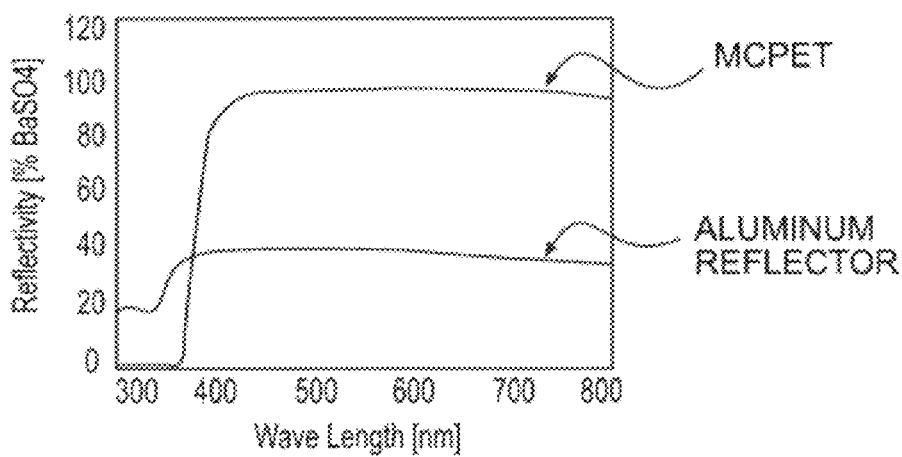
FIG. 9(b) shows the diffuse reflectance of the microcellular reflective sheet in FIG. 8.

The total and diffuse reflectance of the microcellular reflective sheet described above, as a function of wavelength (nM,) is shown in FIGS. 9(a) and 9(b), respectively.

In one embodiment, the present invention relates to a photosensitive optoelectronic device comprising:

a first reflective layer comprising a thermoplastic resin;
a second reflective layer substantially parallel to the first reflective layer;
a first transparent electrode layer on at least one of the first and second reflective layer; and
a photosensitive region adjacent to the first electrode,
wherein the first transparent electrode layer is substantially parallel to the first reflective layer and adjacent to the photosensitive region, and
wherein the device has an exterior face transverse to the planes of the reflective layers where the exterior face has an aperture for admission of incident radiation to the interior of the device.

In one embodiment, the photosensitive optoelectronic device further comprises a second transparent electrode layer, wherein the first transparent electrode layer is adjacent to the first reflective layer and the second transparent electrode layer is substantially parallel to the first reflective layer and adjacent to the photosensitive region in space in opposition to the first electrode.

The first transparent electrode layer and the second transparent electrode layer may each independently comprise a conducting oxide, a conducting carbon nanotube, a conducting polymer, or mixtures thereof.

The thickness of the first reflective layer and second reflective layer independently and generally ranges from 1 mm to 10 mm, such as from 4 mm to 6 mm.

In one embodiment, the thermoplastic resin of the first reflective layer comprises a fluoropolymer resin, such as polytetrafluoroethylene.

The aperture that may be used with the photosensitive optoelectronic device disclosed herein may have a substantially circular, polygonal, or rectangular shape.

In one embodiment, the first and second reflective layers are substantially planar.

The second reflective layer may comprise a metal or a thermoplastic resin, such as a fluoropolymer resin. In one embodiment, the fluoropolymer resin comprises polytetrafluoroethylene.

The photosensitive optoelectronic device described herein may comprise an optical concentrator having an entrance opening and an exit opening wherein the exit opening is attached to the aperture. In one embodiment, the optical concentrator has substantially parabolically sloped sides between the entrance opening and the exit opening. In another embodiment, the optical concentrator has a substantially conical shape between the entrance opening and the exit opening. In still another embodiment, the optical concentrator has a truncated paraboloid shape or trough shape.

The optical concentrator described herein may have different inner surfaces that enhance the properties of the concentrator. For example, in one embodiment, the optical concentrator has an inner surface comprising a plurality of planar regions collectively approximating a conical shape. In another embodiment, optical concentrator has an inner surface comprising a plurality of planar regions collectively approximating a trough shape.

The photosensitive optoelectronic device described herein may also comprise a photosensitive region comprising organic materials that form different desired layers, such as an exciton blocking layer disposed adjacent to the first electrode layer. The photosensitive optoelectronic device may also comprise an exciton blocking layer and second electrode layer, wherein the exciton blocking layer is disposed adjacent to the first electrode layer and the second electrode layer and first reflective layer.

The photosensitive optoelectronic device described herein may further comprise a photosensitive region comprising a hole transporting layer adjacent to an electron transporting layer. Non-limiting examples of the hole transporting layer is CuPc and the electron transporting layer is PTCBI or C60.

In one embodiment, the photosensitive optoelectronic device comprises an exciton blocking layer disposed between the electron transporting layer and one of the first electrode layer and the second electrode and first reflective layer, wherein the second electrode and first reflective layer is a cathode.

Non-limiting examples of the exciton blocking layer comprises 2,9-dimethyl-4,7-diphenyl-1,10-phenanthroline, bathocuproine, or Ruthenium(III) acetylacetonate.

In one embodiment, the photosensitive optoelectronic device comprises a photosensitive region that is a stacked organic photosensitive optoelectronic device.

In addition to organic photosensitive materials, the photosensitive region described herein may comprise inorganic photosensitive materials, such as a silicon based photovoltaic structure.

Another embodiment provides a photosensitive optoelectronic device comprising:
a first reflective layer comprising a thermoplastic resin;
a transparent first electrode layer optionally comprising a conducting oxide or conducting polymer, said first electrode layer adjacent to the first reflective layer;
a photosensitive region adjacent to the first electrode;
a second transparent electrode optionally comprising a conducting oxide or conducting polymer, said second transparent electrode substantially parallel to the first reflective layer and adjacent to the photosensitive region in spaced opposition to the first electrode; and
a second reflective layer comprising a thermoplastic resin substantially parallel to the first reflective layer and adjacent to the second electrode in spaced opposition to the first electrode and photosensitive region,
wherein the device has an exterior face transverse to the planes of the reflective layers where the exterior face has an aperture for admission of incident radiation to the interior of the device.

The thermoplastic resin of at least one of the first or second reflective layers comprise fluoropolymer resin, such as polytetrafluoroethylene.

In one embodiment, the thermoplastic resin of at least one of the first or second reflective layers further comprises barium sulfate coated thereon or doped therein.

Non-limiting examples of the conducting oxide that may be used herein include indium tin oxide (ITO), tin oxide (TO), gallium indium tin oxide (GITO), zinc oxide (ZO), and zinc indium tin oxide (ZITO), and the transparent conductive polymers comprises polyanaline (PANI).

One embodiment provides, an aligned array of light collectors comprising two or more photosensitive optoelectronic devices that are aligned adjacent to one another.

Specific examples of the invention are illustrated and/or described herein. However, it will be appreciated that modifications and variations of the invention are covered by the above teachings and within the purview of the appended claims without departing from the spirit and scope of the invention.

What is claimed is:

1. A photosensitive optoelectronic device comprising:
a first reflective layer comprising a thermoplastic resin;
a second reflective layer substantially parallel to the first reflective layer;
a first transparent electrode layer on at least one of the first and second reflective layer; and
a photosensitive region adjacent to the first electrode,
a second transparent electrode layer substantially parallel to the first reflective layer and adjacent to the photosensitive region in spaced opposition to the first transparent electrode,
wherein the first transparent electrode layer is substantially parallel to the first reflective layer and adjacent to the first reflective layer and the photosensitive region, and
wherein the device has an exterior face transverse to the planes of the reflective layers where the exterior face has an aperture for admission of incident radiation to the interior of the device.

2. The device according to claim 1, wherein the first transparent electrode layer and the second transparent electrode layer each independently comprise a conducting oxide, a conducting carbon nanotube, a conducting polymer, or mixtures thereof.

3. The device according to claim 1, wherein the thickness of the first reflective layer and second reflective layer independently range from 1 mm to 10 mm.

4. The device according to claim 3, wherein the thickness of the first reflective layer and second reflective layer independently range from 4 mm to 6 mm.

5. The device according to claim 1, wherein the thermoplastic resin of the first reflective layer comprises a fluoropolymer resin.

6. The device according to claim 5, wherein the fluoropolymer resin comprises polytetrafluoroethylene.

7. The device according to claim 1, wherein the aperture has a substantially circular, polygonal, or rectangular shape.

8. The device according to claim 1, wherein the first and second reflective layers are substantially planar.

9. The device according to claim 1, wherein the second reflective layer comprises a metal or a thermoplastic resin.

10. The device according to claim 9, wherein the thermoplastic resin of the second reflective layer comprises fluoropolymer resin.

11. The device according to claim 10, wherein the fluoropolymer resin comprises polytetrafluoroethylene.

12. The device according to claim 1, further comprising an optical concentrator having an entrance opening and an exit opening wherein the exit opening is attached to the aperture.

13. The device according to claim 12, wherein the optical concentrator has substantially parabolically sloped sides between the entrance opening and the exit opening.

14. The device according to claim 12, wherein the optical concentrator has a substantially conical shape between the entrance opening and the exit opening.

15. The device according to claim 12, wherein the optical concentrator has a truncated paraboloid shape or trough shape.

16. The device according to claim 12, wherein the optical concentrator has an inner surface comprising a plurality of planar regions collectively approximating a conical shape.

17. The device according to claim 12, wherein the optical concentrator has an inner surface comprising a plurality of planar regions collectively approximating a trough shape.

18. The device according to claim 1, wherein the photosensitive region comprises organic materials.

19. The device according to claim 18, further comprising an exciton blocking layer disposed adjacent to the first electrode layer.

20. The device according to claim 19, further comprising an exciton blocking layer and second electrode layer, wherein the exciton blocking layer is disposed adjacent to the first electrode layer and the second electrode layer and first reflective layer.

21. The device according to claim 20, further comprising an exciton blocking layer disposed between the electron transporting layer and one of the first electrode layer and the second electrode and first reflective layer, wherein the second electrode and first reflective layer is a cathode.

22. The device according to claim 21, wherein the exciton blocking layer comprises 2,9-dimethyl-4,7-diphenyl-1,10-phenanthroline, bathocuproine, or Ruthenium(III) acetylacetonate.

23. The device according to claim 19, wherein the photosensitive region comprises a hole transporting layer adjacent to an electron transporting layer.

24. The device according to claim 23, wherein the hole transporting layer comprises Cu Pc and the electron transporting layer comprises PTCBI or C60.

25. The device according to claim 1, wherein the photosensitive region is a stacked organic photosensitive optoelectronic device.

26. The device according to claim 1, wherein the photosensitive region comprises inorganic photosensitive materials.

27. The device according to claim 1, wherein the photosensitive region is a silicon based photovoltaic structure.

28. An aligned array of light collectors comprising two or more devices according to claim 1 that are aligned adjacent to one another.

29. A photosensitive optoelectronic device comprising:
a first reflective layer comprising a thermoplastic resin;
a transparent first electrode layer optionally comprising a conductive oxide or conducting polymer, said first electrode layer adjacent to the first reflective layer;
a photosensitive region adjacent to the first electrode;
a second transparent electrode optionally comprising a conductive oxide or conducting polymer, said second transparent electrode substantially parallel to the first reflective layer and adjacent to the photosensitive region in spaced opposition to the first electrode; and
a second reflective layer comprising a thermoplastic resin substantially parallel to the first reflective layer and adjacent to the second electrode in spaced opposition to the first electrode and photosensitive region,
wherein the device has an exterior face transverse to the planes of the reflective layers where the exterior face has an aperture for admission of incident radiation to the interior of the device.

30. The device according to claim 29, wherein the thermoplastic resin of at least one of the first or second reflective layers comprise fluoropolymer resin.

31. The device according to claim 30, wherein the fluoropolymer resin comprises polytetrafluoroethylene.

32. The device according to claim 29, wherein the thermoplastic resin of at least one of the first or second reflective layers further comprises barium sulfate coated thereon or doped therein.

33. The device according to claim 29, wherein the conducting oxide is chosen from indium tin oxide (ITO), tin oxide (TO), gallium indium tin oxide (GITO), zinc oxide (ZO), and zinc indium tin oxide (ZITO), and the transparent conductive polymers comprises polyanaline (PANI).

34. An aligned array of light collectors comprising two or more devices according to claim 29 that are aligned adjacent to one another.

* * * * *